United States Patent [19]
Ikuzawa et al.

[11] Patent Number: 5,589,877
[45] Date of Patent: Dec. 31, 1996

[54] AUTOMATIC AMPLITUDE CONTROL CIRCUIT FOR A VECTOR SCOPE

[75] Inventors: Kenzo Ikuzawa; Yoshimichi Hika, both of Kanagawa-ken, Japan

[73] Assignee: Leader Electronics Corporation, Kanagawa-ken, Japan

[21] Appl. No.: 443,168

[22] Filed: May 17, 1995

[30] Foreign Application Priority Data

May 17, 1994 [JP] Japan .................................. 6-102918

[51] Int. Cl.$^6$ .................................................. H04N 17/02
[52] U.S. Cl. ................................................................ 348/186
[58] Field of Search .................................... 348/186, 182, 348/179, 649, 547, 654; H04N 17/02

[56] References Cited

U.S. PATENT DOCUMENTS

| | | | |
|---|---|---|---|
| 3,820,156 | 6/1974 | Schulz . | |
| 3,850,412 | 11/1974 | Olson | 348/186 |
| 4,485,396 | 11/1984 | Sandberg | 348/647 |
| 4,875,089 | 10/1989 | Judge | 348/186 |
| 5,172,229 | 12/1992 | Baker | 348/186 |
| 5,175,614 | 12/1992 | Proebstel . | |

FOREIGN PATENT DOCUMENTS 0506316  9/1992  European Pat. Off. .

OTHER PUBLICATIONS

Fernseh Und Kinotechnik, vol. 39, No. 12, 30 Dec. 1985 Berlin DE, Atreya N. "Dynamisch Messung Und Uberwachung Der F/H–Phase", pp. 597–598.

Philips TV Test Equipment Catalog 1993, Eindhoven (NL), "Philips Test Equipment", pp. 120–123.

Primary Examiner—Victor R. Kostak
Attorney, Agent, or Firm—Fish & Richardson PC

[57] ABSTRACT

A signal processing circuit for a vector scope adapted to display and measure characteristics of a color video signal on a screen which comprises a variable gain circuit 3, a demodulation circuit 6, timing signal generator 7, amplitude detection circuits 8,9, memory 12 storing a reference amplitude and CPU11. An input signal $V_{in}$ through the variable gain circuit is supplied to demodulation circuiting from where chrominance components R-Y, B-Y are provided to the amplitude detection circuits. When the timing signal is provided to the amplitude detection circuits, the circuits detect their amplitudes. The CPU computes an amplitude of a burst signal in accordance with the detected amplitudes and the difference between the computed amplitude and the reference amplitude stored in the memory. If the difference is not zero, the CPU controls the variable gain circuit so that it become zero.

16 Claims, 11 Drawing Sheets

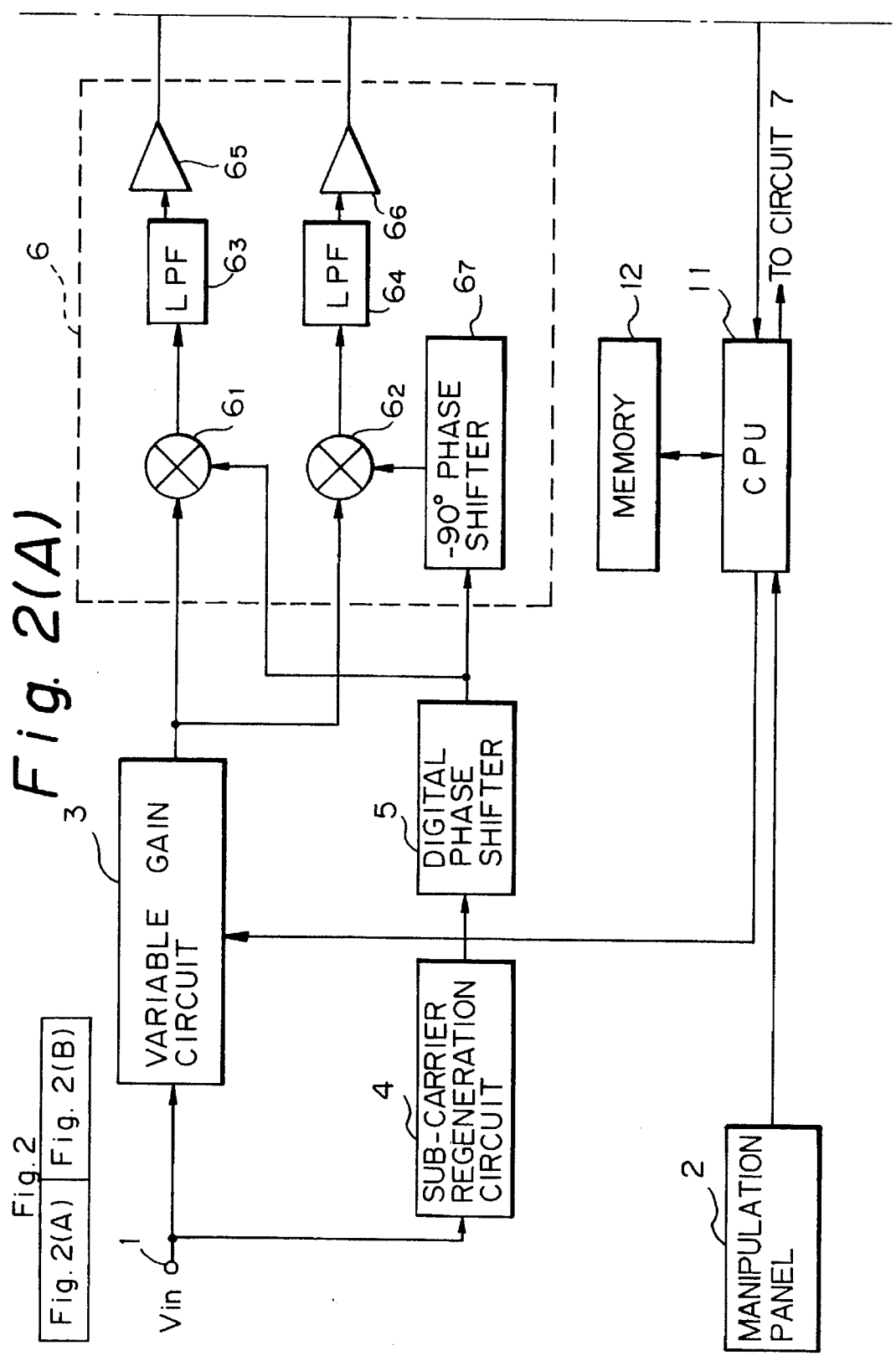

Vin

R−Y

T = T(b)

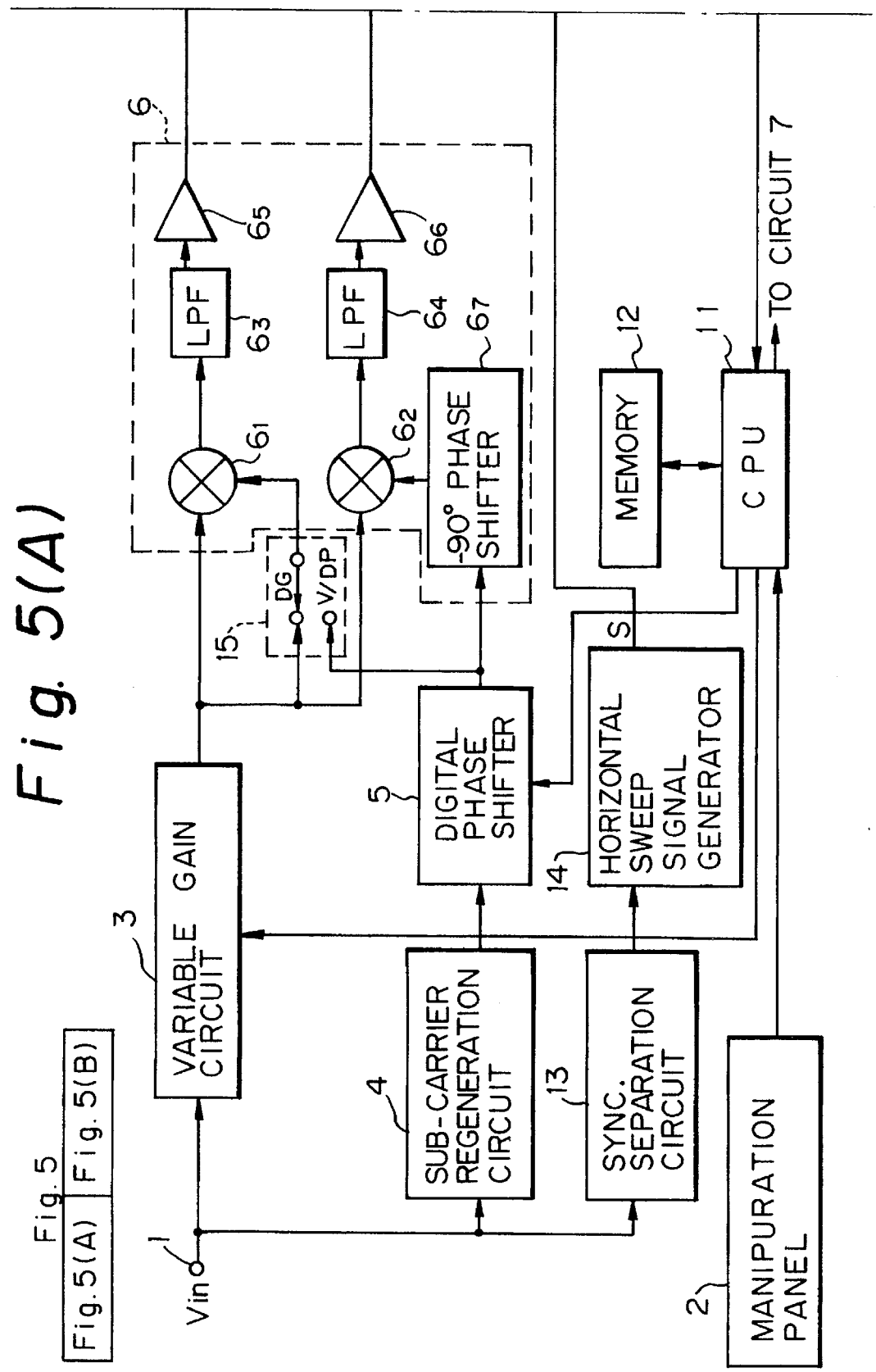

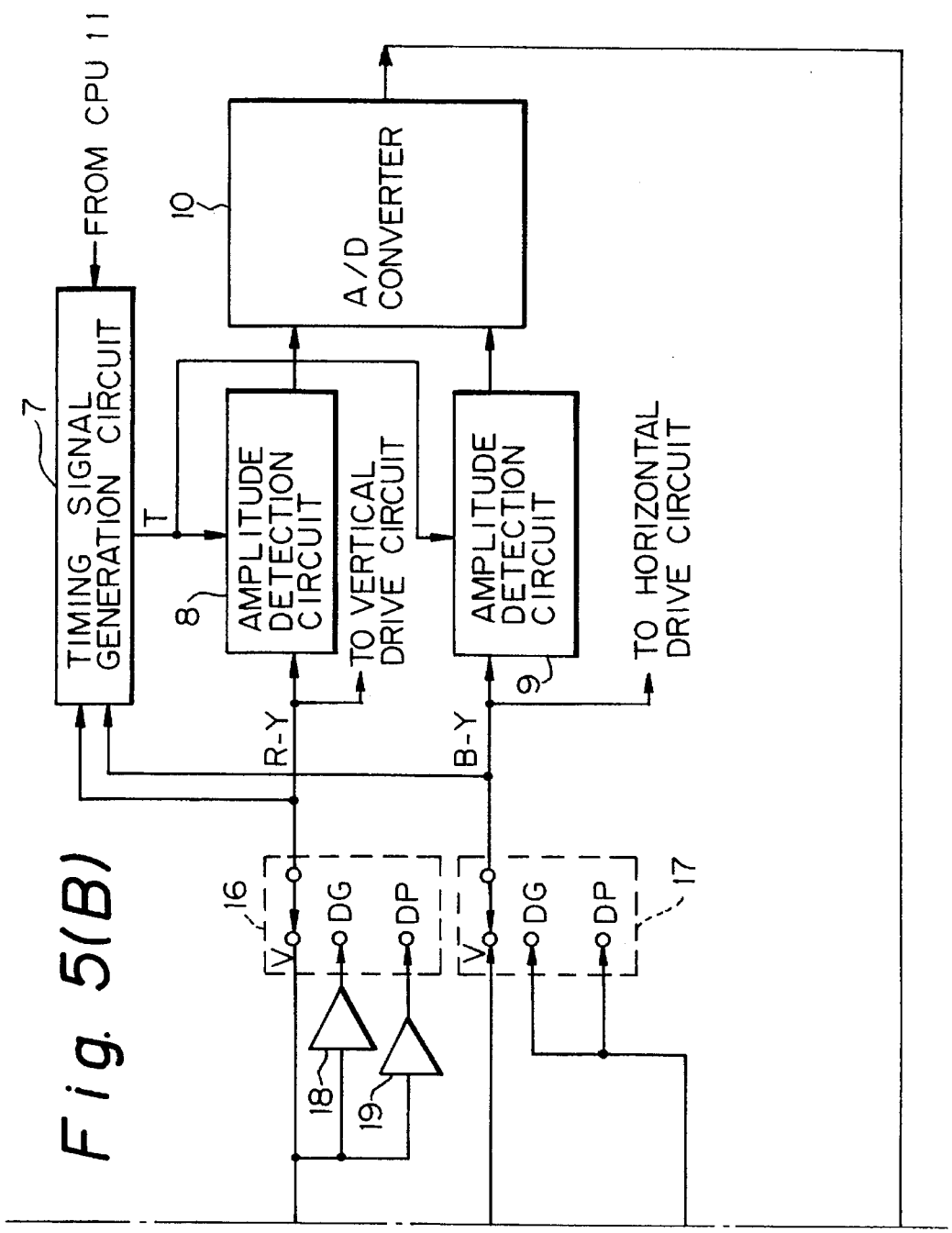

Vin

R − Y

T = T(c)

S

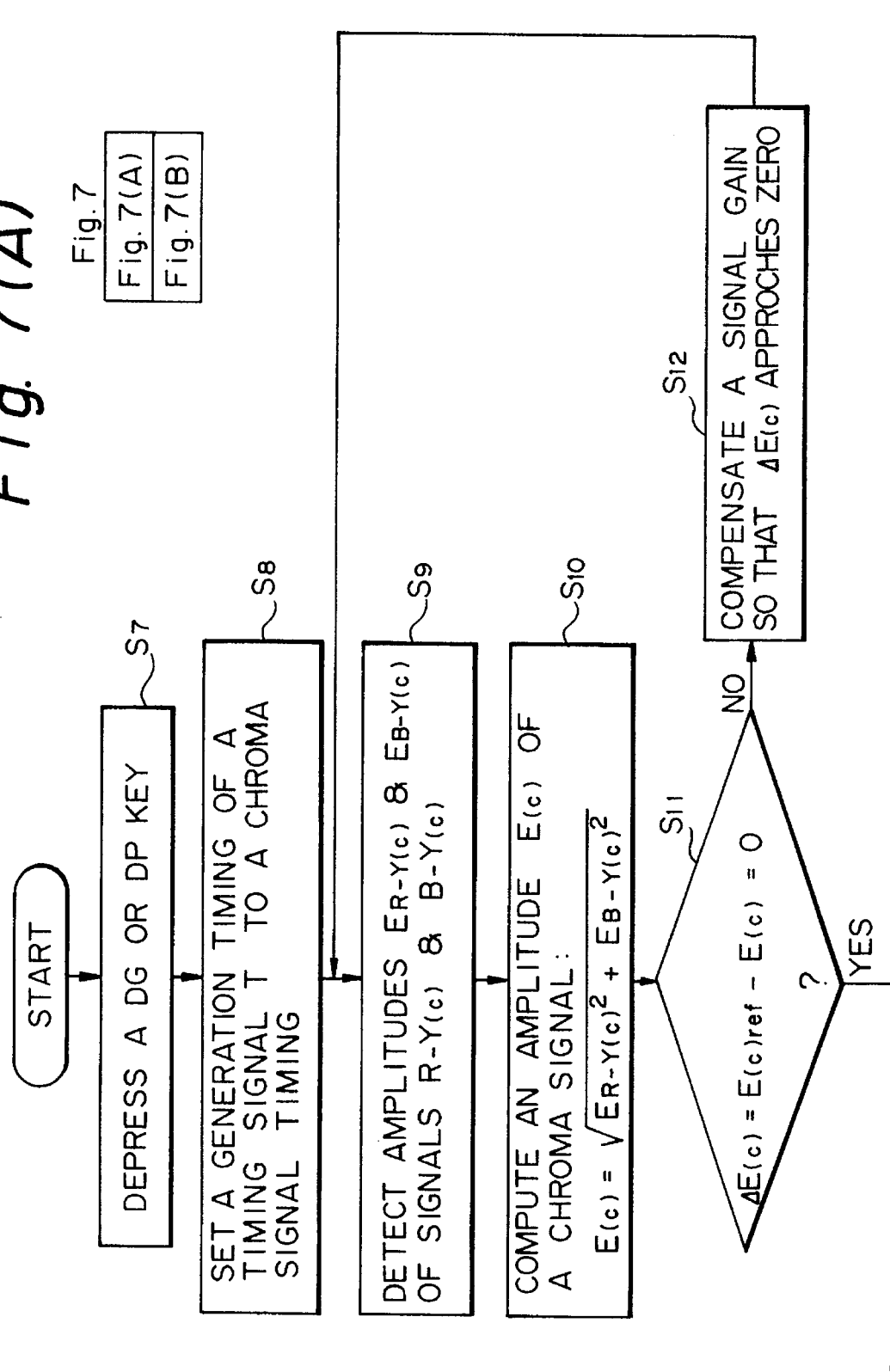

AUTOMATIC AMPLITUDE CONTROL CIRCUIT FOR A VECTOR SCOPE

BACKGROUND OF THE INVENTION:

1. Field of the Invention

The present invention relates to a signal processing circuit for a vector scope adapted to measure the characteristics of a color video signal, and more particularly to a signal processing circuit adapted to automatically set at least one of the amplitudes represented by vectors of a burst signal and a chroma signal at a specified amplitude position on a display screen.

2. Prior Arts

A vector scope in a measuring instrument for demodulating an input color video signal to display in terms of a vector the relation between R-Y and B-Y chrominance components containing color information and being capable of measuring and displaying the characteristics of the color video signal. The angle and amplitude of the displayed vector are related to the hue and the chroma of the color represented by the color information. The display screen of the vector scope is represented as shown in FIG. 1 for example. In FIG. 1, the vertical axis indicates the R-Y component while the horizontal axis indicates the B-Y component. The graduation "a" provided along the circumference of the display screen serves to indicate a phase of the chroma signal contained in the color video signal and is capable of indicating a jitter component contained in a burst signal. The graduation "b" provided at the leftward and of the horizontal axis serves to indicate a differential gain (DG) and a differential phase (DP) of the chroma signal.

In use when a jitter component of a burst signal is desired to be measured, the tip end of a vector representation $V_b$ on the display screen which represents the burst signal must be aligned with the graduation "a", or a circumferential position of the display screen. According to a prior art, a lug on a front manipulation panel is manually operated to control a variable gain circuit incorporated in a signal processing circuit, watching the display screen as to align the tip end of the vector representation of a burst signal with a circumferential position of the display screen.

In the case that a DG or DP of the chroma signal is to be measured, it is necessary to adjust the tip end of a vector representation $V_c$ of the chroma signal to the reference point 0 (the crossing point of the horizontal axis and the circumference). Also in the case, by manually handling lugs of the manipulation panel to control a gain and phase (angle) of the chroma signal, watching the display screen, the tip end of the vector representation of a chroma signal may be adjusted to the reference point 0 of the graduation "b".

Although such a signal processing circuit has already been proposed as a vector representation of a burst signal which may be automatically aligned with the horizontal axis, even such a prior art processing circuit requires an amplitude of the vector representation to the manually adjusted and an amplitude and angle of a vector representation of a chroma signal cannot be automatically adjusted to given values.

As explained above, according to the prior art, the amplitude and/or the angle of the vector representation have to be adjusted to and aligned with the given values by manually handling the lugs of the manipulation panel, watching the display screen. As the consequence, the operation is cumbersome and it is difficult to align the vector representation accurately with the specified positions (in respect of the amplitude and angle).

SUMMARY OF THE INVENTION:

The present invention has been proposed in light of the problems associated with a prior art as above explained. Accordingly, a first object of the present invention is to provide a signal processing circuit for a vector scope, capable of automatically setting an amplitude of a vector representation of a burst signal contained in a color video signal to a predetermined amplitude so that the vector scope may be used easily.

A second object of the present invention is to provide a signal processing circuit for a vector scope, capable of automatically setting at least an amplitude and/or an angle of a vector representation of a chroma signal contained in a color video signal to predetermined amplitude and/or angle so that the vector scope may be used easily.

The first object of this invention is achieved by a signal processing circuit for a vector scope which includes (a) variable gain means for varying a gain of said color video signal input to the signal processing circuit; (b) chrominance signal generation means, in response to a signal output from said variable gain means, for detecting and generating first and second chrominance signals; (c) first detection means, in response to said first and second chrominance signals, for detecting an amplitude of a burst signal contained in the color video signal; (d) first memory means for previously storing a reference amplitude of said burst signal; and (e) gain adjusting means for comparing the amplitude of said burst signal detected by said first detection means with said reference amplitude stored in said first memory means and adjusting the gain at said variable gain means so that they coincide with each other.

The second object of this invention is achieved by a signal processing circuit for a vector scope which comprises (a) variable gain means for varying a gain of said color video signal input to the signal processing circuit; (b) chrominance signal generation means, in response to a signal output from said variable gain means, for detecting and generating a first and second chrominance signals; (c) detection means, in response to said first and second chrominance signals, for detecting an amplitude and/or a phase of a chroma signal contained in the color video signal; (d) memory means for previously storing a reference amplitude (and/or reference phase) of said chroma signal; and (e) gain adjusting means for comparing the amplitude and/or phase of said chroma signal detected by said detection means with said reference amplitude and/or phase stored in said memory means and adjusting the gain at said variable gain means and/or the phase-shift value at a phase-shift means so that the both of them coincide with each other.

BRIEF DESCRIPTION OF THE DRAWINGS:

FIGS. 2, 2(A) and 2(B) show a block diagram of a signal processing circuit in a vector scope, according to an embodiment of the present invention;

FIGS. 5, 5(A) and 5(B) show a block diagram of a signal processing circuit in a vector scope, according to another embodiment of the present invention;

FIGS. 7, 7(A) and 7(B) show an operational flow chart of the circuit shown in FIG. 5 in the DG/DP automatic setting mode.

Figure 2B:
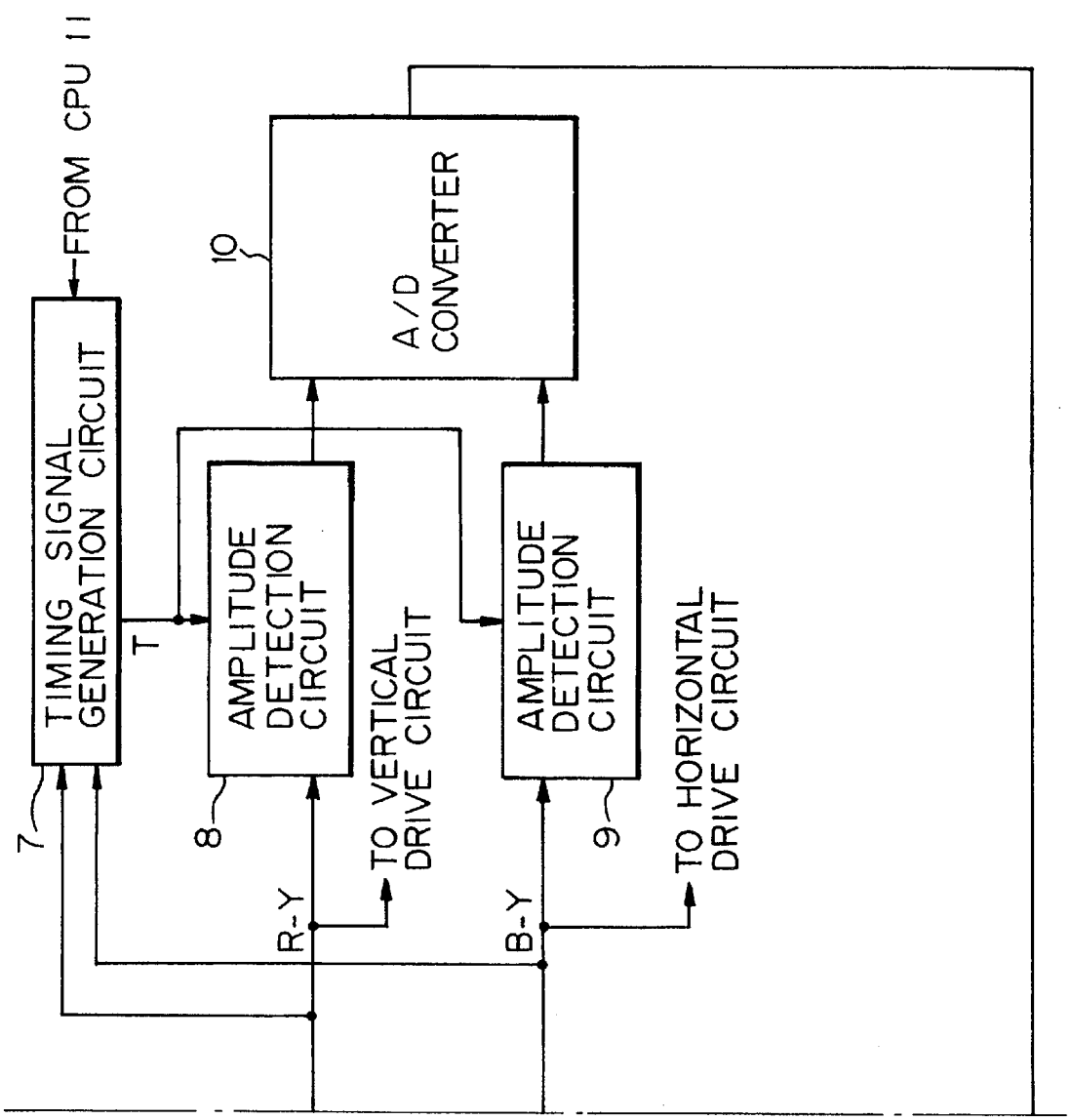

DESCRIPTION OF THE PREFERRED EMBODIMENTS:

FIGS. 2(A) and 2(B) show an embodied signal processing circuit in a vector scope according to the present invention. In FIG. 2(A), reference numeral 1 designates an input terminal to which a color video signal $V_{in}$ is applied, 2 a manipulation panel, 3 a variable gain circuit of a voltage control type (a variable gain amplifier), 4 a sub-carrier regeneration circuit adapted to regenerate a sub-carrier signal from the color video signal $V_{in}$, and 5 a digital phase shifter adapted to shift a phase of the sub-carrier signal regenerated at the circuit 4. Reference numeral 6 designates a demodulation circuit which receives an output signal from the variable gain circuit 3 and an output signal from the digital phase shifter 5. The demodulation circuit 6 includes multipliers $6_1$ and $6_2$, low pass filters (LPF) $6_3$ and $6_4$, amplifiers $6_5$ and $6_6$ having the same gain and a phase shifter $6_7$ adapted to shift a phase of the output signal from the digital phase shifter 5 by −90°, and outputs vector signals R-Y and B-Y which are chrominance components of the input color video signal. These R-Y and B-Y signal are supplied respectively to vertical and horizontal drive circuits (not shown) for driving the vertical and horizontal axes of the display screen of the vector scope so that the components of the color video signal may be displayed in terms of vector.

Referring to FIG. 2(B), reference numeral 7 designates a timing signal generation circuit which generates a timing signal T by monitoring R-Y and B-Y signals coming from the demodulation circuit 6, 8 and 9 amplitude detection circuits comprising sample and hold circuits having the same operation timing which is stipulated by the timing signal T supplied from the timing signal generation circuit 7. Numeral 10 designates an analog/digital (A/D) converter which converts analog signals coming from the amplitude detection circuits 8 and 9 into digital signals, and 11 a microprocessor (CPU) which controls the variable gain circuit 3 and the timing signal generation circuit 7 as well as operation of the entire vector scope.

Referring to FIG. 2(A) again, reference numeral 12 designates a read/write memory which stores a reference amplitude value $E_{(b)ref}$ at a predetermined address. The reference amplitude value $E_{(b)ref}$ is used for setting an amplitude $E_{(b)}$ of a vector representation of a burst signal contained in the color video signal to a predetermined amplitude corresponding to the value $E_{(b)ref}$. It is to be noted that the reference amplitude value $E_{(b)ref}$ is preferably so set that the amplitude of the vector representation coincides with the circumference of the display screen, in the course of measurement of jitter component. It is, of course, also to be noted that the amplitude need not necessarily coincide with the circumference but can be set at any arbitrary value if necessary. Accordingly, the value $E_{(b)ref}$ is changeable by operating the manipulation panel 2 by a user.

An operation of the signal processing circuit shown in FIG. 2 will next be explained in detail by referring to FIGS. 3 and 4.

Figure 3A:
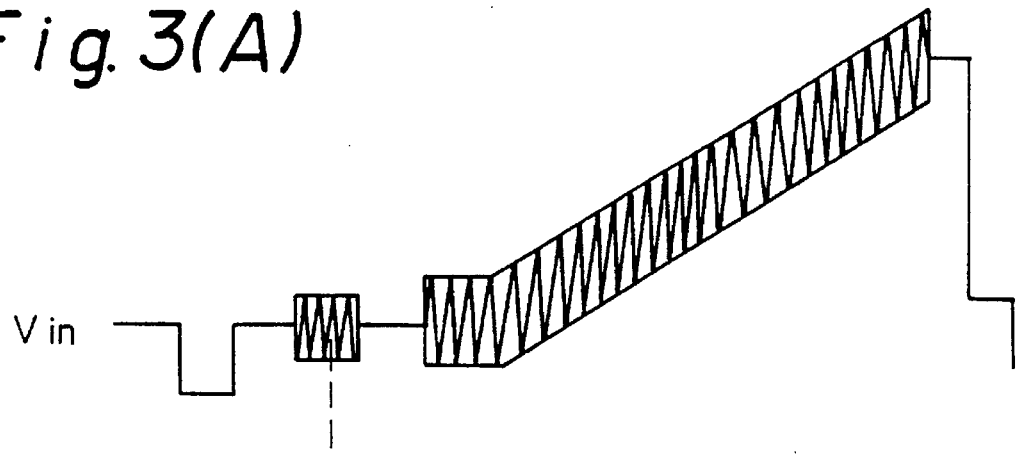
FIGS. 3(A)–3(C) respectively illustrate timing waveforms of input video signal, R-Y component and timing signal in the circuit shown in FIG. 2 in a burst signal amplitude automatic setting mode.
Figure 3B:
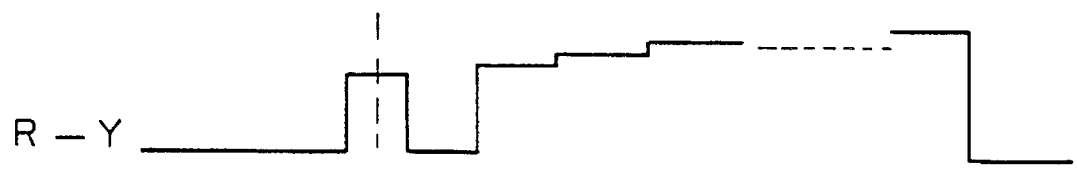

When a color video signal $V_{in}$, as shown in FIG. 3(A) is input to the input terminal 1, the signal is supplied to the demodulation circuit 6 via the variable gain circuit 3. The color video signal is also supplied to the sub-carrier regeneration circuit 4 where a sub-carrier signal is regenerated. The sub-carrier signal is then supplied to the demodulation circuit 6 via the phase shifter 5. The demodulation circuit 6 supplies, in turn, R-Y and B-Y signals as shown in FIG. 3(B). These R-Y and B-Y signals are respectively provided to the vertical and horizontal drive circuits to drive the vertical and horizontal axes of the display screen of a vector scope.

What has been described above is the operation of the signal processing circuit in the case of the normal mode.

Figure 3C:
Figure 4:
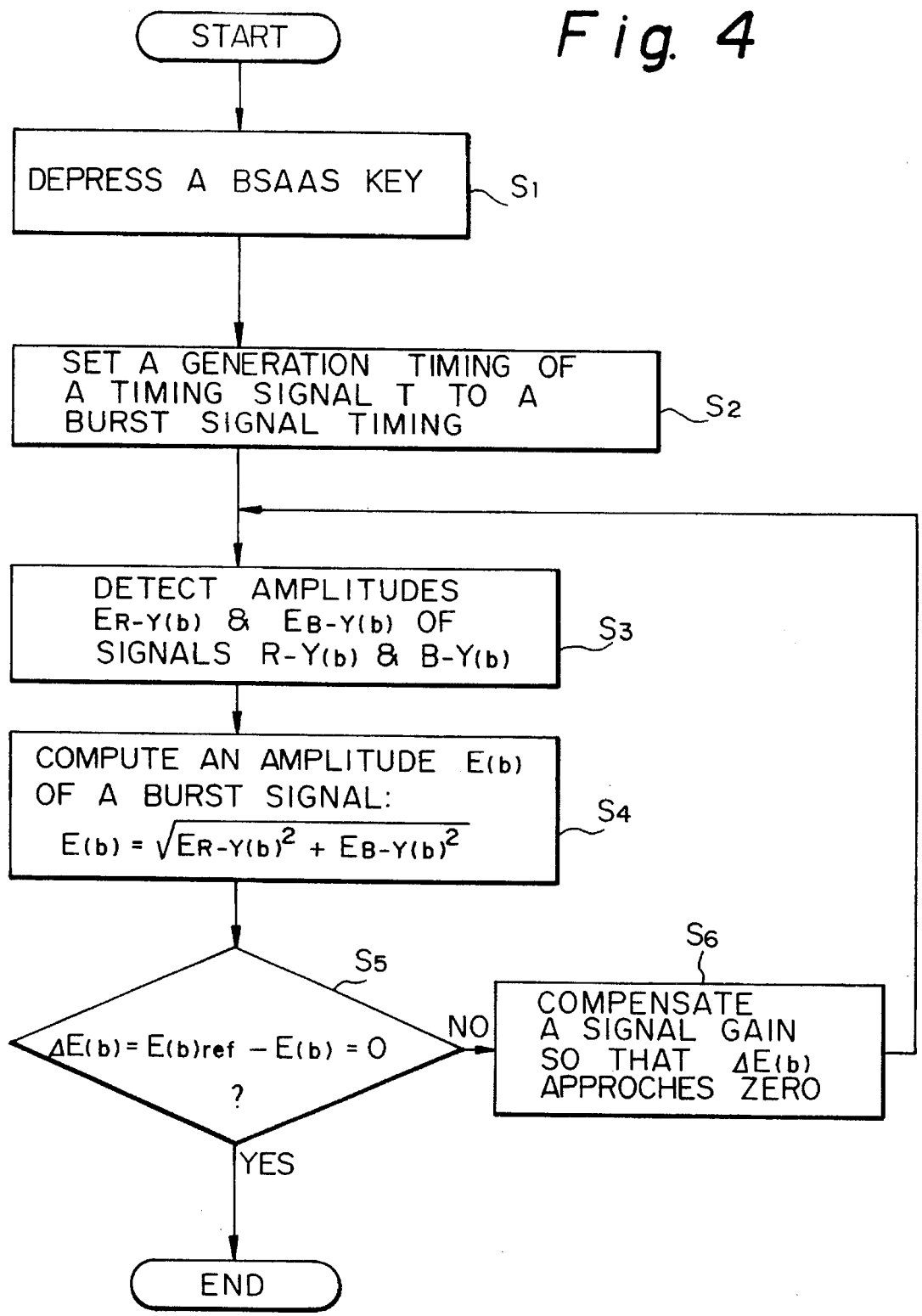
FIG. 4 shows an operational flow chart of the circuit shown in FIG. 2 in the burst signal amplitude automatic setting mode.

In order to automatically set an amplitude of a vector representation of a burst signal to a preset size, or in order to implement a burst signal amplitude automatic setting mode (BSAAS mode), an associated key on the manipulation panel 2 is depressed at Step $S_1$ in FIG. 4 by a user. It is assumed that a reference amplitude value $E_{(b)ref}$ has been stored in the memory 12 by entering the value from the manipulation panel 2. At Step $S_2$, the CPU11 sets the timing signal generation circuit 7 to a burst mode so that the circuit 7 generates a timing signal T as a burst timing signal $T_{(b)}$ at a timing corresponding to the burst signal as shown in FIG. 3(C), by monitoring R-Y signal or B-Y signal provided from the demodulation circuit 6. This causes, in Step $S_3$, the amplitude level of the burst signal parts R-$Y_{(b)}$ and B-$Y_{(b)}$ of R-Y and B-Y signals from the demodulation circuit 6 to be detected respectively at the amplitude detection circuits 8 and 9 and then converted by the A-D converter 10 to digital amplitude signals $E_{R-Y(b)}$ and $E_{B-Y(b)}$.

These amplitude signals $E_{R-Y(b)}$ and $E_{B-Y(b)}$ are input to CPU11 where an amplitude value $E_{(b)}$ at that time of the vector representation of the burst signal is obtained by computing the square root of $E_{R-Y(b)}^2 + E_{B-Y(b)}^2$ in accordance with the supplied amplitude signals in Step $S_4$. Namely, $$E_{(b)} = \sqrt{E_{R-Y(b)}^2 + E_{B-Y(b)}^2}$$

In Step $S_5$, the difference between the obtained amplitude value $E_{(b)}$ and the reference amplitude value $E_{(b)ref}$ which has been read out from the memory 12, or $\Delta E_{(b)}$ (=$E_{(b)ref}$−$E_{(b)}$) is computed and whether or not $\Delta E(b)$ is zero is decided.

In the case that the difference $\Delta E_{(b)}$ is not zero, the process proceeds to Step $S_6$ so as to control the gain of the variable gain control 3 in such a manner as the difference $\Delta E_{(b)}$ is made to be zero. Subsequently, in Step $S_3$, the amplitude value $E_{(b)}$ is computed again and Steps $S_3$ through $S_6$ are implemented repeatedly until $\Delta E_{(b)}$=0 is attained in Step $S_5$. In Step $S_5$, if $\Delta E(b)$=0 is attained, the BSAAS mode is finished. In the present description, the expression "the difference is zero" signifies simply that it is mathematically or ideally zero. However, in an actual operation, it signifies that the difference is zero in the minimum resolution which is set in advance.

In this way, the amplitude value $E_{(b)}$ of the vector representation of the burst signal may be automatically set to the predetermined reference amplitude value $E_{(b)ref}$.

Although the signal processing circuit shown in FIG. 2 can be so constituted that the phase shift amount in the digital phase shifter 5 may be controlled by manually rotating a lug on the manipulation panel 2 in order to coincide an angle (or phase) of the vector representation of a burst signal with a specified vector angle $\theta_{(b)ref}$ such as zero (coincident with the horizontal axis), it is preferably constituted so that a so-called one-touch operation of a switch on the operational panel allows the angle to automatically coincide with the reference angle $\theta_{(b)ref}$. In order to attain the one-touch operation for the angle, the reference angle (or phase) $\theta_{(b)ref}$ may be previously stored in the memory 12, and a burst signal phase automatic setting mode (BSPAS mode) may performed. In the BSPAS mode, when a burst phase automatic setting key (BSPAS key) is depressed, the same operations as in Steps $S_2$- $S_3$ are practiced and then the following equation is computed:

$$\Theta_{(b)} = \cos^{-1} \frac{E_{B-Y(b)}}{\sqrt{E_{R-Y(b)}^2 + E_{B-Y(b)}^2}}$$

After the calculation above, the reference angle $\theta_{(b)ref}$ is read out from the memory 12 and the following calculation is performed:

$$\Delta\theta_{(b)}\theta_{(b)ref}-\theta_{(b)}$$

If the phase difference $\Delta\theta_{(b)}$ is not zero, the procedure goes to a phase compensation operation where the phase-shift amount at the phase-shifter is controlled to make $\Delta\theta_{(b)}=0$.

In FIGS. 5(A) and 5(B), there is shown a signal processing circuit for a vector scope according to another embodiment of the present invention which is capable of operating in accordance with the BSAAS mode as explained above and also is capable of operating a DG/DP automatic setting mode. The term "DG/DP automatic setting mode" signifies such a mode as when a differential gain (DG) key or differential phase (DP) key on the manipulation panel 2 is depressed, an automatic adjustment is made so that an amplitude and/or phase of a vector representation of a chroma signal will coincide with a specified value which has been set in advance and the variation in amplitude or phase of a color video signal is displayed on the vector scope to measure the DG or DP level.

In the signal processing circuit shown in FIG. 5, components identical or similar to those shown in FIG. 2 are identified with the same reference numerals. In addition to the components of the circuit shown in FIG. 2, the signal processing circuit shown in FIG. 5 further includes a synchronizing signal separation circuit 13, horizontal sweep signal generator 14, three switching circuits 15 through 17 and two amplifiers 18, 19 having different gains.

In the signal processing circuit shown in FIG. 5, when the circuit is operated in the BSAAS mode, the switching circuit 15 is rendered to connect to a V/DP terminal and the switching circuits 16 and 17 are rendered to connect to V terminals respectively under a control of the CPU11 when it receives a burst signal amplitude automatic setting signal from the manipulation panel 2. By these switching operations, a signal channel or path similar to that of the signal processing circuit shown in FIG. 2 is formed whereby the BSAAS mode is executed as described above in connection with FIG. 2.

The operation of the DG/DP automatic setting mode in the signal processing circuit shown in FIG. 5 will next be explained by referring to FIGS. 6 and 7.

Figure 6A:
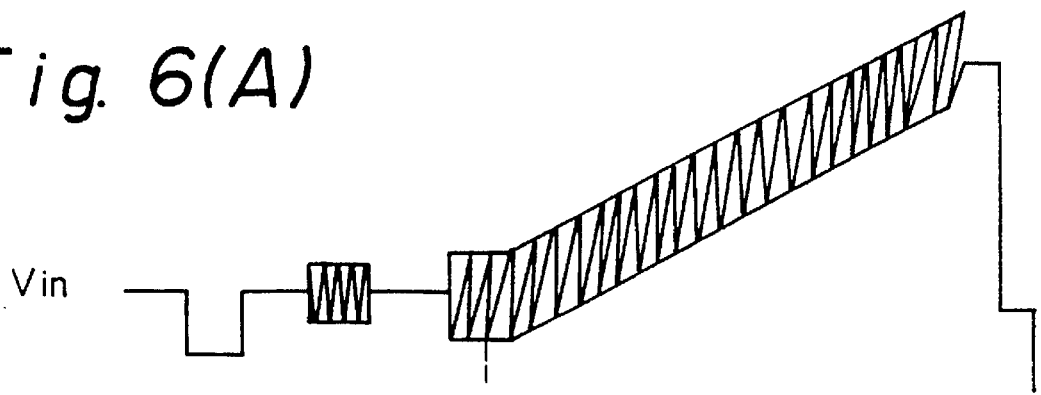
FIGS. 6(A)–6(D) respectively illustrate timing waveforms of input video signal, R-Y component, timing signal and sweep signal in the circuit shown in FIG. 5 in a DG/DP automatic setting mode.
Figure 6B:
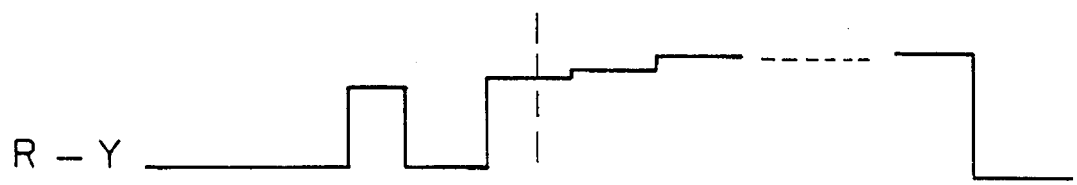
Figure 6C:
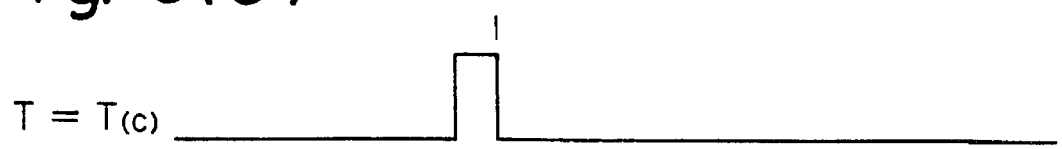
Figure 6D:
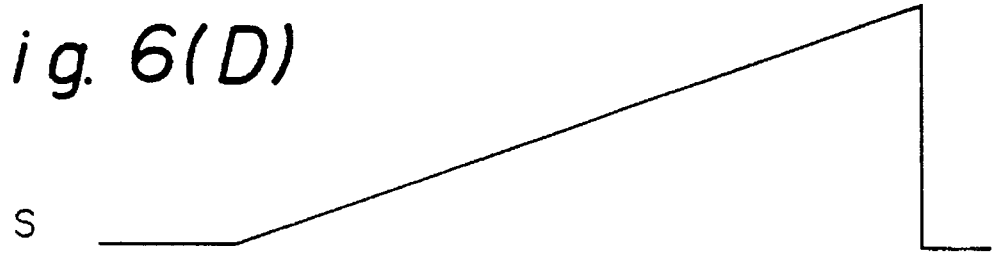
Figure 7B:
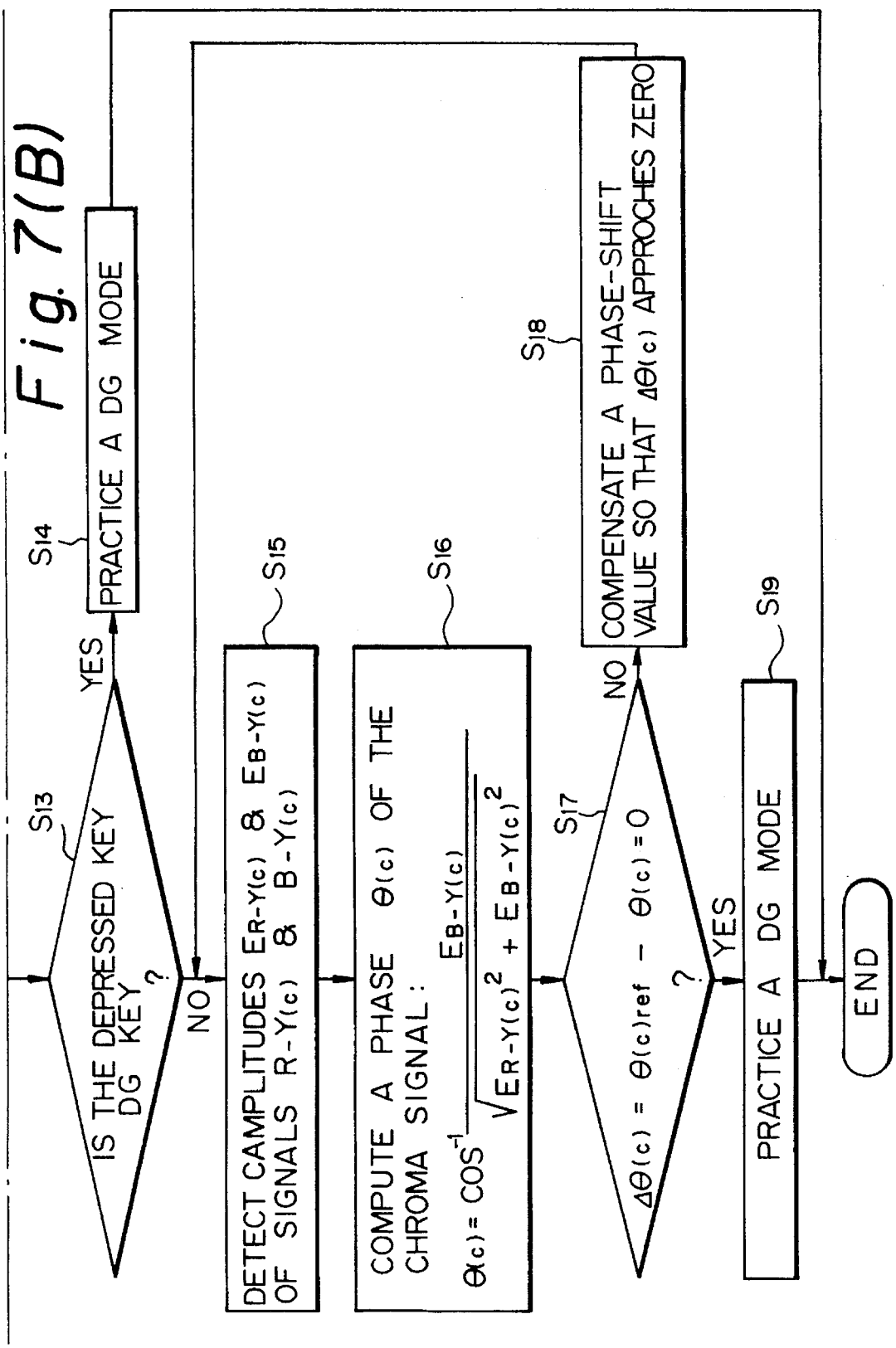

FIGS. 6(A)–6(D) illustrate waveforms of signals output from components in the signal processing circuit shown in FIG. 5 and FIGS. 7(A) and 7(B) show a flow chart in the DG/DP automatic setting mode therein. FIG. 6(A) designates a color video signal $V_{in}$ of one horizontal period, which is supplied to the video signal input terminal 1, FIG. 6(B) designates R-Y signal or (B-Y signal) which is output from the demodulation circuit 6, FIG. 6(C) designates a timing signal T ($=T_{(c)}$) output from the timing signal generation circuit, and FIG. 6(D) designates a horizontal sweep signal S output from the horizontal sweep signal generator 14.

It is assumed that reference amplitude value $E_{(c)ref}$ and reference angle $\theta_{(c)ref}$ of a chroma signal are previously set and stored in specified respective addresses in the memory 12.

In Step $S_7$ in FIG. 7(A), when either of the DG key or the DP key on the manipulation panel is depressed, DG/DP automatic setting mode will be activated. Then in Step $S_8$, the switching circuit 15 is controlled to connect to the V/DP terminal while the switching circuits 16 and 17 are controlled to connect to the V terminals. The signal generation timing of the timing signal generation circuit 7 is changed to a chroma mode so that the timing signal generation circuit 7 generates the timing signal T as the signal $T_{(c)}$ in the chroma signal timing interval shown in FIG. 6(C) by monitoring R-Y signal or B-Y signal output from the demodulation circuit 6.

By receiving the timing signal $T_{(c)}$, the amplitude detection circuits 8 and 9 detect the levels of the amplitudes of the chroma signal components R-$Y_{(c)}$ and B-$Y_{(c)}$ of the R-Y signal and B-Y signal output from the demodulation circuit 6, and then the amplitude levels are converted into digital amplitude signals $E_{R-Y(c)}$ and $E_{B-Y(c)}$, in Step $S_9$.

These amplitude signals $E_{R-Y(c)}$ and $E_{B-Y(c)}$ are input in Step $S_{10}$ to the CPU11 which, in turn, computes the amplitude value $E_{(c)}$ of the chroma signal by computing the square root of $E_{R-Y(c)}^2 + E_{B-Y(c)}^2$, that is:

$$E_{(c)} = \sqrt{E_{R-Y(c)}^2 + E_{B-Y(c)}^2}$$

In Step $S_{11}$, the difference $\Delta E_{(c)}$ between the computed amplitude value $E_{(c)}$ and the reference amplitude value $E_{(c)ref}$ read out from the memory 12 is computed, and if the difference $\Delta E_{(c)}$ is not zero, the gain of the variable gain circuit 3 is so controlled that the difference will be zero in Step $S_{12}$. Again in Step $S_9$, the amplitude value $E_{(c)}$ is computed and thus, Steps $S_9$ through $S_{12}$ will be repeatedly executed until $\Delta E(c)=0$ is detected in Step $S_{11}$.

If $\Delta E_{(c)}$ is attained in Step $S_{11}$, the amplitude $E_{(c)}$ of the vector representation of the chroma signal has coincided with the reference amplitude value $E_{(c)ref}$ which has been stored in the memory 12.

Figure 8A:
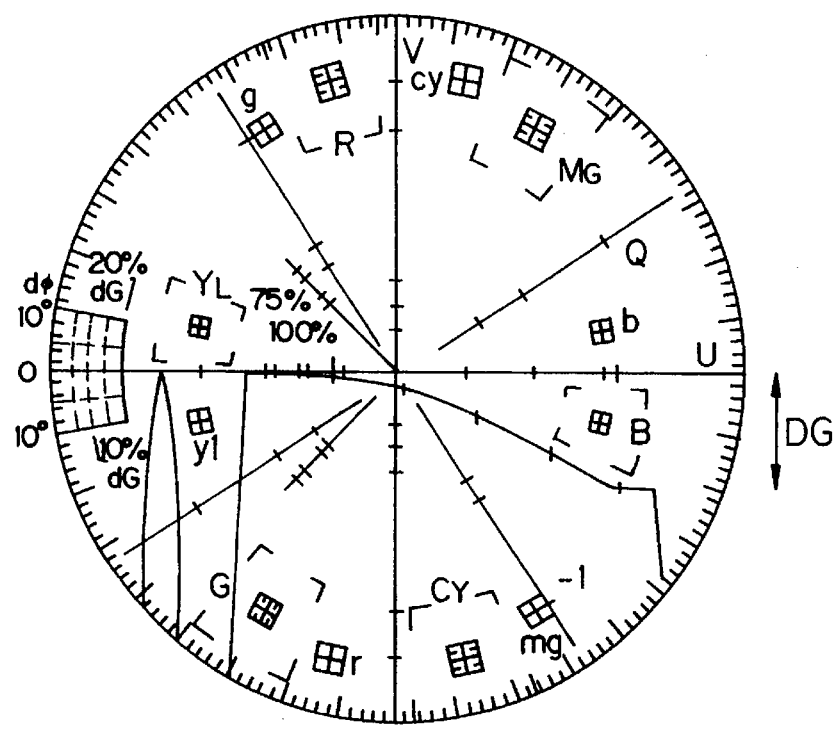
FIG. 8(A) illustrates a symbolic view of a display screen of a vector scope in the DG automatic setting mode.

Next, the process proceeds to Step $S_{13}$ in FIG. 7(B), where it is detected whether the depressed key is DG key or DP key. When the DG key has been depressed, a DG mode is exercised in Step $S_{14}$. In this DG mode, the switching circuits 15 through 17 are subjected to connect to DG terminals, which causes a horizontal axis of the display screen to be driven by the horizontal sweep signal S, shown in FIG. 7(D), coming from the horizontal sweep signal generator 14 and the vertical axis to be driven by an amplitude signal through the amplifier 18, whereby the amplitude level of one horizontal cycle is displayed on the display screen as shown in FIG. 8(A).

If it is detected that the DG key has not been depressed, the process proceeds from Step $S_{13}$ to Step $S_{15}$. It is to be understood that in the case that DG key is decided not to be depressed in Step $S_{13}$, it means that the DP key has been depressed. The switching circuit 15 remains as connected to the V/DP terminal while the switching circuits 16 and 17 remain as connected to the V terminals. In Step $S_{15}$, the amplitudes of the R-$Y_{(c)}$ signal and B-$Y_{(c)}$ signal are detected, and in Step $S_{16}$, using the digital amplitude signals $E_{R-Y(c)}$ and $E_{B-Y(c)}$ supplied from the A/D converter to CPU11, the phase or the angle $\theta_{(c)}$ of vector representation of the chroma signal is calculated as follows.

$$\Theta_{(c)} = \cos^{-1} \frac{E_{B-Y(c)}}{\sqrt{E_{R-Y(c)}^2 + E_{B-Y(c)}^2}}$$

Next, in Step $S_{17}$, the difference $\Delta\theta_{(c)}$ between the acquired angle $\theta_{(c)}$ and the reference angle $\theta_{(c)ref}$ or $\Delta\theta_{(c)} = \theta_{(c)ref} - \theta_{(c)}$, will be calculated so as to decide whether the difference $\Delta\theta_{(c)}$ is zero or not. If the difference is not zero, the process proceeds to Step $S_{18}$ to control the phase shift value at the digital phase shifter 5 so that the difference $\theta_{(c)}$ may be zero. Steps $S_{15}$ through $S_{18}$ are repeatedly performed, until $\Delta\theta_{(c)}=0$ is obtained in Step $S_{17}$. By this phase adjustment, the angle $\theta_{(c)}$ of the vector representation of the chroma signal may be made to coincide with the reference angle $\theta_{(c)ref}$.

Figure 8B:
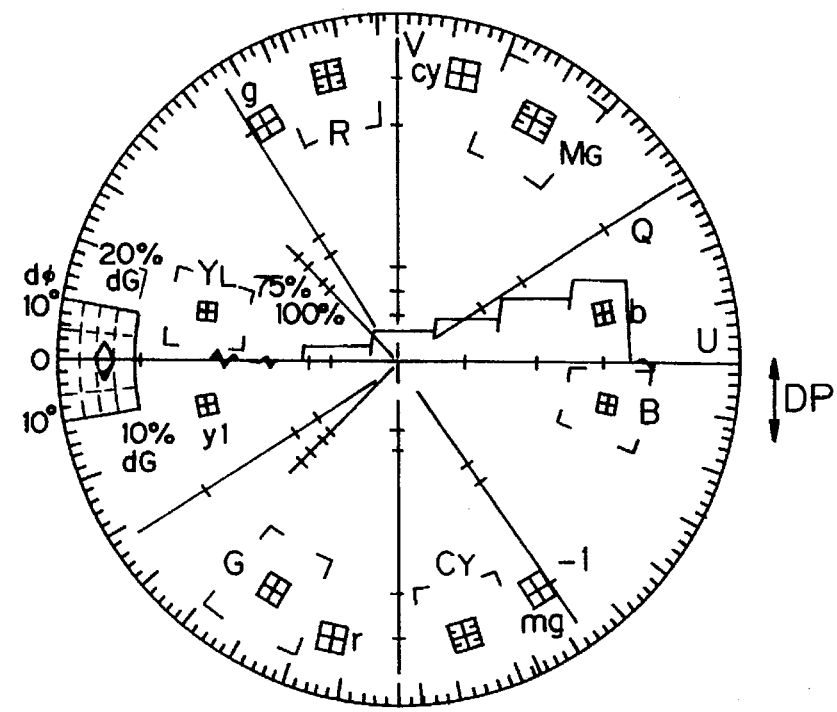
FIG. 8(B) illustrates a symbolic view of a display screen of a vector scope in the DP automatic setting mode.

When $\Delta\theta_{(c)}=0$ is decided in Step $S_{17}$, a DP mode is executed in Step $S_{19}$. In this DP mode, the switching circuit 15 remains to connect to the V/DP terminal while the switching circuits 16 and 17 are switched to DP terminals whereby the horizontal axis of the display screen is driven by the horizontal sweep signal S as shown in FIG. 6(D) coming from the horizontal sweep signal generator 14 and the vertical axis is driven by the R-Y signal which has been amplified by the amplifier 19. Accordingly, the phase level of the color video signal is displayed on the display screen as shown in FIG. 8(B).

It is also possible to respectively execute Steps $S_{15}$ and $S_{13}$ immediately after Steps $S_{11}$ and $S_{17}$, wherein Steps $S_{14}$ and $S_{19}$ are respectively connected with YES branch and NO branch of Step $S_{13}$. In this case, it is also possible to perform Steps $S_{15}$ - $S_{18}$ before Steps $S_9$ - $S_{12}$.

Figure 1:
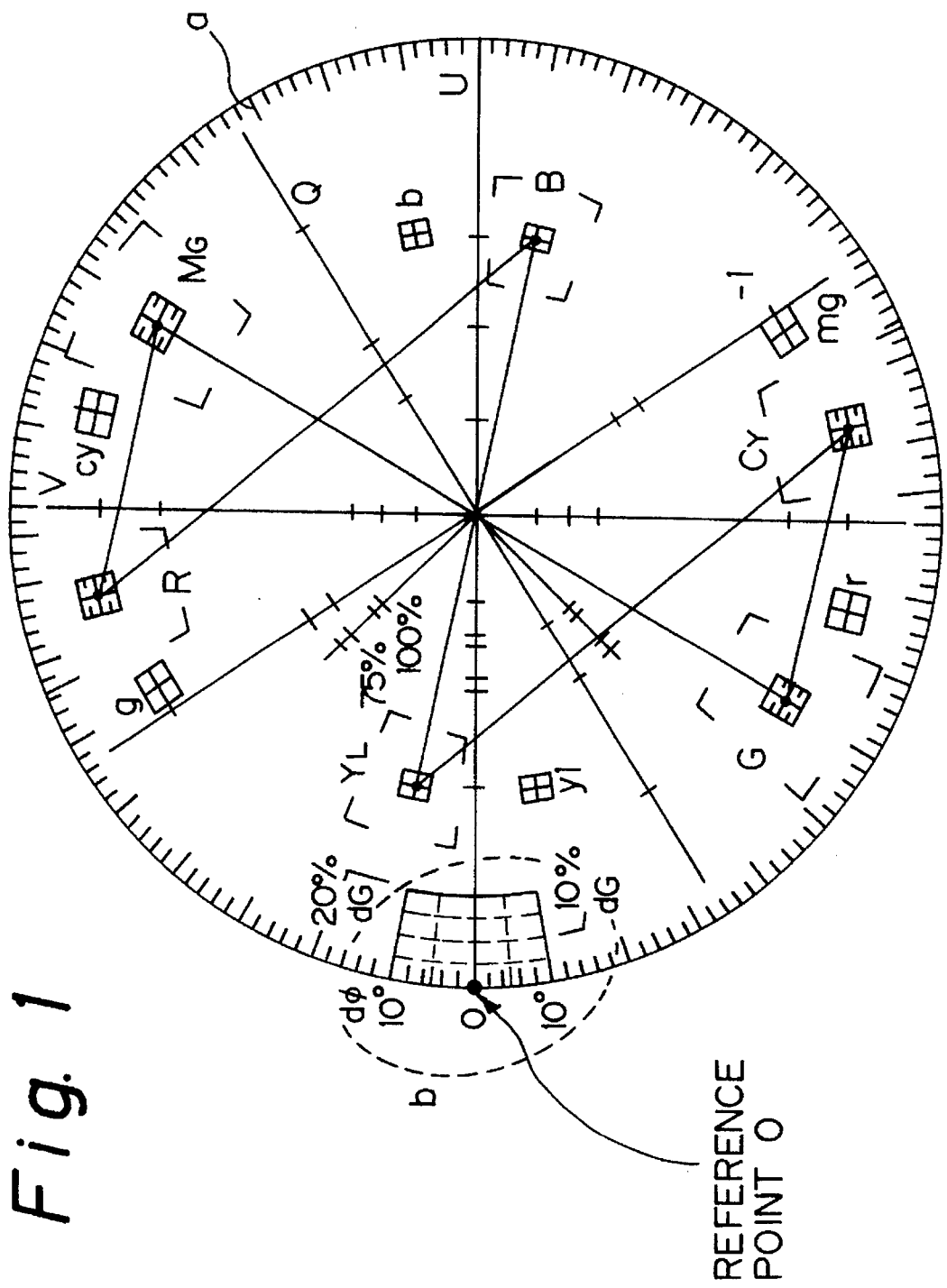
FIG. 1 shows a symbolic display screen of a vector scope.

As explained above, by executing Steps $S_7$ - $S_{19}$ shown in FIGS. 7(A) and 7(B), the amplitude and angle of the vector representation of the chroma signal can be automatically adjusted to the reference amplitude and angle $E_{(c)ref}$ and $\theta_{(c)ref}$, and thus the tip end of the vector representation can be coincided with, for instance, a reference point "0" of the graduation "b" on the display screen shown in FIG. 1. Therefore, the DG and DP values can be measured by reading out the valves from the graduation "b". Further, the DG and DP levels of the color video signal can be displayed at an optimum level.

Since the present invention is constituted as above explained, a vector representation of a burst signal contained in a color video signal may be automatically and precisely adjusted to a given amplitude. Further, a vector representation of a chroma signal can be automatically and precisely set to a given amplitude and angle (or phase). Accordingly, operability of a vector scope may be enhanced and there will not be caused any specific difference in positioning accuracy for users.

In particular, in the circuit shown in FIGS. 5(A) and 5(B), since it is able to comply with both the BSAAS mode and DG/DP automatic setting mode, an area required for the circuit can be made smaller in comparison with separate circuits which can carry out the same modes as in the subject circuit.

The invention has been described in detail with particular reference to certain preferred embodiments, but it will be understood that variations and modifications can be effected with in the spirit and scope of the invention.

What is claimed is:

1. A signal processing circuit for a vector scope adapted to display and measure characteristics of a color video signal on a screen therein comprising:

(a) variable gain means for varying a gain of said color video signal input to the signal processing circuit;

(b) chrominance signal generation means, in response to a signal output from said variable gain means, for detecting and generating first and second chrominance signals;

(c) first detection means, in response to said first and second chrominance signals, for detecting an amplitude of a burst signal contained in the color video signal;

(d) first memory means for previously storing a reference amplitude of said burst signal; and (e) gain adjusting means for comparing the amplitude of said burst signal detected by said first detection means with said reference amplitude stored in said first memory means and adjusting the gain at said variable gain means so that they coincide with each other.

2. A signal processing circuit according to claim 1, further comprising:

(f) second detection means for detecting a phase of said burst signal;

(g) second memory means for previously storing a reference phase of said burst signal; and (h) phase adjusting means for comparing the phase of said burst signal detected by said second detection means with said reference phase stored in said second memory means and adjusting a phase-shift value of a sub-carrier at a phase-shift means included in said chrominance signal generation means so that they coincide with each other.

3. A signal processing means according to claim 1, wherein said first detection means comprises:

timing signal generation means for generating a timing signal during a time period associated with said burst signal of said color video signal;

chrominance amplitude detection means for detecting amplitudes of said first and second chrominance signals; and calculating means for calculating the amplitude of said burst signal, on the basis of the detected amplitudes of said first and second chrominance signals.

4. A signal processing means according to claim 2, wherein said first detection means comprises:

timing signal generation means for generating a timing signal during a time period associated with said burst signal of said color video signal;

chrominance amplitude detection means for detecting amplitudes of said first and second chrominance signals; and calculating means for calculating the amplitude of said burst signal, on the basis of the detected amplitudes of said first and second chrominance signals.

5. A signal processing circuit according to claim 4, wherein said second detection means comprises:

means for calculating the phase of said burst signal, on the basis of the detected amplitudes of said first and second chrominance signals.

6. A signal processing circuit for a vector scope adapted to display and measure characteristics of a color video signal on a screen therein comprising:

(a) variable gain means for varying a gain of said color video signal input to the signal processing circuit;

(b) chrominance signal generation means, in response to a signal output from said variable gain means, for detecting and generating first and second chrominance signals;

(c) first detection means, in response to said first and second chrominance signals, for detecting an amplitude of a chroma signal contained in the color video signal;

(d) first memory means for previously storing a reference amplitude of said chroma signal; and (e) gain adjusting means for comparing the amplitude of said chroma signal detected by said first detection means with said reference amplitude stored in said first memory means and adjusting the gain at said variable gain means so that they coincide with each other.

7. A signal processing circuit according to claim 6, further comprising:

(f) second detection means for detecting a phase of said chroma signal;

(g) second memory means for previously storing a reference phase of said chroma signal; and (h) phase adjusting means for comparing the phase of said chroma signal detected by said second detection means with said reference phase stored in said second memory means and adjusting a phase-shift value of a sub-carrier at a phase-shift means included in said chrominance signal generation means so that they coincide with each other.

8. A signal processing means according to claim 6, wherein said first detection means comprises:

timing signal generation means for generating a timing signal during a time period associated with said chroma signal of said color video signal;

chrominance amplitude detection means for detecting amplitudes of said first and second chrominance signals; and calculating means for calculating the amplitude of said chroma signal, on the basis of the detected amplitudes of said first and second chrominance signals.

9. A signal processing means according to claim 7, wherein said first detection means comprises:

timing signal generation means for generating a timing signal during a time period associated with said chroma signal of said color video signal;

chrominance amplitude detection means for detecting amplitudes of said first and second chrominance signals; and calculating means for calculating the amplitude of said burst signal, on the basis of the detected amplitudes of said first and second chrominance signals.

10. A signal processing circuit according to claim 9, wherein said second detection means comprises:

means for calculating the phase of said chroma signal, on the basis of the detected amplitudes of said first and second chrominance signals.

11. A signal processing circuit for a vector scope adapted to display and measure characteristics of a color video signal on a screen therein comprising:

(a) variable gain means for varying a gain of said color video signal input to the signal processing circuit;

(b) chrominance signal generation means, in response to a signal output from said variable gain means, for detecting and generating first and second chrominance signals;

(c) first detection means, in response to said first and second chrominance signals, for selectively detecting amplitudes of burst and chroma signals contained in the color video signal;

(d) second detection means, in response to said first and second chrominance signals, for selectively detecting phases of said burst and chroma signals;

(e) memory means for previously storing reference amplitudes and phases of said burst and chroma signals;

(f) gain adjusting means for comparing the amplitude of said burst or chroma signal selectively detected by said first detection means with the corresponding reference amplitude stored in said memory means and adjusting the gain at said variable gain means so that they coincide with each other; and (g) phase adjusting means for comparing the phase of said burst or chroma signal selectively detected by said second detection means with the corresponding reference phase stored in said memory means and adjusting a phase-shift value of a sub-carrier at a phase-shift means included in said chrominance signal generation means so that they coincide with each other.

12. A signal processing means according to claim 11, wherein said detection means comprises:

timing signal generation means for selectively generating timing signals during time periods associated with said burst and chroma signals of said color video signal;

chrominance amplitude detection means for detecting amplitudes of said first and second chrominance signals; and calculating means for selectively calculating the amplitudes of said burst and chroma signals, on the basis of the detected amplitudes of said first and second chrominance signals.

13. A signal processing circuit according to claim 12, wherein said second detection means comprises:

calculating means for selectively calculating the phase of said burst and chroma signals, on the basis of said first and second chrominance signals.

14. A signal processing circuit according to claim 11, further comprising:

(h) third detection means for detecting a synchronizing signal of said video signal;

(i) horizontal sweep signal generation means, in response to the detected synchronizing signal, for generating a sweep signal;

(j) first switching means for selectively applying said first chrominance signal and said sweep signal to horizontal axis drive means; and (k) second switching means for selectively applying said second chrominance signal and a signal representing the amplitude of said color video signal to vertical axis drive means, whereby waveforms of differential gain (DG) and differential phase (DP) are selectively displayed on the screen.

15. A signal processing circuit according to claim 12, further comprising:

(h) third detection means for detecting a synchronizing signal of said video signal;

(i) horizontal sweep signal generation means, in response to the detected synchronizing signal, for generating a sweep signal;

(j) first switching means for selectively applying said first chrominance signal and said sweep signal to horizontal axis drive means; and (k) second switching means for selectively applying said second chrominance signal and a signal representing the amplitude of said color video signal to vertical axis drive means, whereby waveforms of differential gain (DG) and differential phase (DP) are selectively displayed on the screen.

16. A signal processing circuit according to claim 13, further comprising:

(h) third detection means for detecting a synchronizing signal of said video signal;

(i) horizontal sweep signal generation means, in response to the detected synchronizing signal, for generating a sweep signal;

(j) first switching means for selectively applying said first chrominance signal and said sweep signal to horizontal axis drive means; and (k) second switching means for selectively applying said second chrominance signal and a signal representing the amplitude of said color video signal to vertical axis drive means, whereby waveforms of differential gain (DG) and differential phase (DP) are selectively displayed on the screen.

* * * * *